(12) United States Patent
Kuznetsov et al.

(10) Patent No.: US 12,025,575 B2
(45) Date of Patent: *Jul. 2, 2024

(54) SOFT X-RAY OPTICS WITH IMPROVED FILTERING

(71) Applicant: KLA Corporation, Milpitas, CA (US)

(72) Inventors: Alexander Kuznetsov, Austin, TX (US); Boxue Chen, San Jose, CA (US); Nikolay Artemiev, Berkeley, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/468,489

(22) Filed: Sep. 7, 2021

(65) Prior Publication Data

US 2021/0404979 A1 Dec. 30, 2021

Related U.S. Application Data

(63) Continuation of application No. 16/841,301, filed on Apr. 6, 2020, now Pat. No. 11,143,604.

(51) Int. Cl.
*G01N 23/20008* (2018.01)
*G01N 23/201* (2018.01)
(Continued)

(52) U.S. Cl.
CPC ..... *G01N 23/20008* (2013.01); *G01N 23/201* (2013.01); *G21K 1/062* (2013.01); *G21K 1/10* (2013.01); *G01N 2223/6116* (2013.01)

(58) Field of Classification Search
None
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |
| (Continued) | | |

FOREIGN PATENT DOCUMENTS

| JP | 2011022012 A | 2/2011 |
| JP | 2011141129 A | 7/2011 |
| (Continued) | | |

OTHER PUBLICATIONS

Emaillet, et al., "Intercomparison between optical and x-ray scatterometry measurements of FinFET structures," Proc. SPIE, v. 8681, p. 86810Q, 2013.

(Continued)

*Primary Examiner* — Hoon K Song
(74) *Attorney, Agent, or Firm* — Spano Law Group; Joseph S. Spano

(57) ABSTRACT

Optical elements that efficiently propagate x-ray radiation over a desired energy range and reject radiation outside the desired energy range are presented herein. In one aspect, one or more optical elements of an x-ray based system include an integrated optical filter including one or more material layers that absorb radiation having energy outside the desired energy band. In general, the integrated filter improves the optical performance of an x-ray based system by suppressing reflectivity within infrared (IR), visible (vis), ultraviolet (UV), extreme ultraviolet (EUV) portions of the spectrum, or any other undesired wavelength region. In a further aspect, one or more diffusion barrier layers prevent degradation of the integrated optical filter, prevent diffusion between the integrated optical filter and other material layers, or both. In some embodiments, the thickness of one or more material layers of an integrated optical filter vary over the spatial area of the filter.

9 Claims, 11 Drawing Sheets

(51) Int. Cl.
*G21K 1/06* (2006.01)
*G21K 1/10* (2006.01)

(56) References Cited

U.S. PATENT DOCUMENTS

| | | | |
|---|---|---|---|
| 6,023,338 A | 2/2000 | Bareket | |
| 6,429,943 B1 | 8/2002 | Opsal et al. | |
| 6,716,646 B1 | 4/2004 | Wright et al. | |
| 6,724,462 B1 | 4/2004 | Singh et al. | |
| 6,778,275 B2 | 8/2004 | Bowes | |
| 6,787,773 B1 | 9/2004 | Lee | |
| 6,992,764 B1 | 1/2006 | Yang et al. | |
| 7,242,477 B2 | 7/2007 | Mieher et al. | |
| 7,321,426 B1 | 1/2008 | Poslavsky et al. | |
| 7,351,980 B2 | 4/2008 | Lange | |
| 7,406,153 B2 | 7/2008 | Berman | |
| 7,478,019 B2 | 1/2009 | Zangooie et al. | |
| 7,599,470 B2 | 11/2009 | Kloepfel et al. | |
| 7,626,702 B2 | 12/2009 | Ausschnitt et al. | |
| 7,656,528 B2 | 2/2010 | Abdulhalim et al. | |
| 7,705,331 B1 | 4/2010 | Kirk et al. | |
| 7,826,071 B2 | 11/2010 | Shchegrov et al. | |
| 7,842,933 B2 | 11/2010 | Shur et al. | |
| 7,873,585 B2 | 1/2011 | Izikson | |
| 7,920,676 B2 | 4/2011 | Yun et al. | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 8,749,179 B2 | 6/2014 | Liu et al. | |
| 8,941,336 B1 | 1/2015 | Liu et al. | |
| 9,291,554 B2 | 3/2016 | Kuznetsov et al. | |
| 9,885,962 B2 | 2/2018 | Veldman et al. | |
| 9,915,522 B1 | 3/2018 | Jiang et al. | |
| 10,013,518 B2 | 7/2018 | Bakeman et al. | |
| 10,101,670 B2 | 10/2018 | Pandev et al. | |
| 10,324,050 B2 | 6/2019 | Hench et al. | |
| 10,352,695 B2 | 7/2019 | Dziura et al. | |
| 11,143,604 B1* | 10/2021 | Kuznetsov | G01B 15/08 |
| 2003/0008148 A1 | 1/2003 | Bajt et al. | |
| 2003/0021465 A1 | 1/2003 | Adel et al. | |
| 2003/0067598 A1 | 4/2003 | Tomie et al. | |
| 2004/0061930 A1 | 4/2004 | Wedowski | |
| 2004/0170252 A1 | 9/2004 | Richardson | |
| 2005/0117233 A1 | 6/2005 | Kanazawa | |
| 2006/0103725 A1 | 5/2006 | Brown et al. | |
| 2007/0221842 A1 | 9/2007 | Morokuma et al. | |
| 2007/0228288 A1 | 10/2007 | Smith et al. | |
| 2008/0273662 A1 | 11/2008 | Yun et al. | |
| 2009/0152463 A1 | 6/2009 | Toyoda et al. | |
| 2010/0188655 A1 | 7/2010 | Brown et al. | |
| 2010/0188738 A1 | 7/2010 | Epple et al. | |
| 2010/0213395 A1 | 8/2010 | Ueno et al. | |
| 2011/0141865 A1 | 6/2011 | Senekerimyan et al. | |
| 2011/0240890 A1 | 11/2011 | Govindaraju et al. | |
| 2011/0266440 A1 | 11/2011 | Boughorbel et al. | |
| 2012/0292502 A1 | 11/2012 | Langer et al. | |
| 2013/0208279 A1 | 8/2013 | Smith | |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2015/0046121 A1 | 2/2015 | Dziura et al. | |
| 2015/0110249 A1 | 4/2015 | Bakeman et al. | |
| 2015/0117610 A1 | 4/2015 | Veldman et al. | |
| 2015/0204664 A1 | 7/2015 | Bringoltz et al. | |
| 2015/0204802 A1 | 7/2015 | Pois et al. | |
| 2015/0300965 A1 | 10/2015 | Sezginer et al. | |
| 2017/0131129 A1 | 5/2017 | Ahr et al. | |
| 2017/0284949 A1 | 10/2017 | Omote et al. | |
| 2017/0365371 A1 | 12/2017 | Huang et al. | |
| 2018/0106735 A1 | 4/2018 | Gellineau et al. | |
| 2019/0017946 A1* | 1/2019 | Wack | G01N 23/20008 |
| 2019/0212281 A1 | 7/2019 | Shchegrov et al. | |
| 2019/0215940 A1 | 7/2019 | Khodykin et al. | |
| 2019/0285989 A1* | 9/2019 | Enkisch | G03F 7/70958 |
| 2019/0302042 A1 | 10/2019 | Yun et al. | |

FOREIGN PATENT DOCUMENTS

| | | |
|---|---|---|
| JP | 6601118 B2 | 11/2019 |
| WO | 2019036512 A1 | 2/2019 |

OTHER PUBLICATIONS

Kline, et al., "X-ray scattering critical dimensional metrology using a compact x-ray source for next generation semiconductor devices," J. of Micro/Nanolithography, MEMS, and MOEMS, 16(1), 014001 (2017).

Eriksson, Fredrik, et al., "14.5% near-normal incidence reflectance of Cr Sc x-ray multilayer mirrors for the water window," Optics letters 28.24 (2003): 2494-2496.

Supplementary European Search Report completed on Feb. 7, 2024, for European Patent Application No. EP 21784781 filed by KLA Corporation, 2 pages.

* cited by examiner

180

| Bilayer Filter | CONTAMINATION BAND | | | SXR |
|---|---|---|---|---|
| | 30-40eV | 40-50eV | 50-60eV | 397.9eV |
| No Filter | 1.1% | 1.4% | 0.52% | 53.1% |
| 13.4nm Te/10.5nm $SiO_2$ | 0.21% | 0.12% | 0.04% | 46.0% |
| 14.4nm Te/10.5nm $SiO_2$ | 0.23% | 0.10% | 0.06% | 45.8% |
| 15.4nm Te/10.5nm $SiO_2$ | 0.28% | 0.07% | 0.12% | 45.2% |
| 13.4nm Te/9.5nm $SiO_2$ | 0.35% | 0.05% | 0.04% | 45.9% |
| 13.4nm Te/10.5nm $SiO_2$ | 0.23% | 0.10% | 0.06% | 45.8% |
| 13.4nm Te/10.5nm $SiO_2$ | 0.15% | 0.18% | 0.10% | 45.5% |

SOFT X-RAY OPTICS WITH IMPROVED FILTERING

CROSS REFERENCE TO RELATED APPLICATION

The present application for patent is a continuation of, and claims priority under 35 U.S.C. § 120 from, U.S. patent application Ser. No. 16/841,301, entitled "Soft X-Ray Optics With Improved Filtering," filed Apr. 6, 2020, the subject matter of each is incorporated herein by reference in its entirety.

TECHNICAL FIELD

The described embodiments relate to x-ray optics, and more particularly to thin film optical layers employed to filter out of band radiation in optical systems.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations, and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

Metrology systems based on x-ray based scatterometry and reflectometry measurements have emerged as suitable tools for dimensional metrology of semiconductor structures. X-ray based metrology systems have exhibited measurement capability for both low and high aspect ratio structures. In some applications, x-ray based metrology systems feature an illumination beam spot size compatible with scribe-line targets. X-ray based metrology systems have made it possible to efficiently develop and validate measurement recipes for challenging measurement applications and operate in a high volume manufacturing (HVM) environment without substantial prior dimensional and material composition information.

Highly reflective multilayer optics are a critical component of the optical systems of x-ray based measurement and processing systems. Highly reflective multilayer optics typically employ repeating pairs of different material film layers. Each pair of layers includes an absorber material layer and a spacer material layer. Common absorber materials include Tungsten (W), Tungsten disilicide ($WSi_2$), Ruthenium (Ru), Vanadium (V), Lanthanum (La), Molybdenum (Mo), Titanium dioxide ($TiO_2$), Nickel (Ni), etc. Common spacer materials include Carbon (C), Boron nitride (BN), Boron Carbide ($B_4C$), Silicon (Si), etc.

FIG. 1 depicts an illustration of a cross-sectional view of a multilayer optic 10 used in soft x-ray applications. A set of repeated pairs of multilayer coatings 12 is fabricated over a Silicon substrate 11. The top four repeated pairs of multilayer coatings 13A-D are illustrated. Each repeated pair of multilayer coatings includes a spacer layer (e.g., layer 15 of repeated pair 13A) and an absorber layer (e.g., layer 14 of repeated pair 13A). In the embodiment depicted in FIG. 1, the spacer layer is fabricated from Scandium (Sc), and the absorber layer is fabricated from Chromium (Cr). In one embodiment, the set of multilayer coatings 12 includes four hundred repeated pairs of multilayer coatings. The spatial period, P, of the set of multilayer coatings (i.e., thickness of each repeated material pair) is 1.56 nanometers to satisfy the Bragg condition. Additional description of the multilayer optic depicted in FIG. 1 is presented in "14.5% near-normal incidence reflectance of Cr Sc x-ray multilayer mirrors of the water window," by Eriksson, Fredrik, et al., Optics letters 28-24 (2003): 2494-2496, the content of which is incorporated herein by reference in its entirety.

The reflectivity of multilayer optic 10 is typically extremely sensitive to incident angle and beam energy (i.e., wavelength). FIG. 2 is a plot 20 illustrative of a simulation of the reflectivity of multilayer optic 10 as a function of beam energy for an angle of incidence of five degrees. The simulation employs the Fresnel equations assuming ideal, flat interfaces. The optical constants associated with each material (i.e., delta and beta constants) are derived using scattering factor tables from the Center For X-Ray Optics (CXRO) of the materials science division of the Lawrence Berkeley National Laboratory (accessible via Internet at http://henke.lbl.gov/optical_constants/. As depicted in FIG. 2, a maximum reflectivity of 53.1% is achieved at beam energy of 399 electronvolts (3.11 nanometers), which is within the range of soft x-ray radiation (e.g., 80-3,000 eV).

Broadband, soft x-ray based metrology, requires high reflectivity at soft x-ray wavelengths. However, lower energy radiation (e.g., EUV, UV, visible, IR) contaminates soft x-ray based measurements. Unfortunately, as illustrated in FIG. 2, the traditional multilayer optic 10 employed in soft X-ray systems exhibits high reflectivity in the extreme ultraviolet (EUV) spectrum (e.g., 10 eV-80 eV). This is caused by the increasing contrast of the refractive index between air and mirror materials (e.g., Cr or Sc) as photon energy decreases. As a result, soft x-ray based systems employing traditional multilayer optic 10 suffer from EUV light contamination.

Traditionally, one or more transmissive, stand-alone optical filters are employed in an optical path of a soft x-ray system to filter light contamination outside the desired soft x-ray energy band, e.g., EUV, UV, visible, IR. These transmissive, stand-alone optical filters are fabricated from an extremely thin membrane of material (e.g., 5-50 nanometers thick) that spans the cross-section of the x-ray beam (e.g., hundreds of micrometers to several millimeters across). These extremely thin membranes, which are unsupported over a relatively large distance, are costly and extremely fragile. This negatively impacts the reliability and practical utility of current soft x-ray based systems.

In summary, there is a need for x-ray based systems with improved optics. The improved optics should enable efficient propagation of x-ray radiation over a desired energy range and rejection of radiation outside the desired energy range. In particular, optics capable of propagating broadband, soft x-ray radiation, and rejecting wavelengths in the EUV, UV, visible, and IR portions of the spectrum are desired.

SUMMARY

Optical elements that efficiently propagate x-ray radiation over a desired energy range and reject radiation outside the desired energy range are presented herein. By way of non-limiting example, the optical elements described herein are implemented in any of an x-ray metrology system, a projection lithography system, a microscopy system, an astronomical system, a spectroscopic system, a laser illumination source including laser cavities and optics, a synchrotron illumination source, etc.

In one aspect, one or more optical elements of an x-ray based system include an integrated optical filter including one or more material layers that absorb radiation having energy outside the desired energy band. In general, the integrated filter improves the optical performance of an x-ray based system by suppressing reflectivity within infrared (IR), visible (vis), ultraviolet (UV), extreme ultraviolet (EUV) portions of the spectrum, or any other undesired wavelength region.

In some embodiments, a multilayer X-ray reflecting optic includes an integrated optical filter including one or more material layers that absorb radiation having energy below the desired energy band. The integrated optical filter may include a single material layer, two material layers, or more than two material layers depending on the desired wavelength range or wavelength ranges to be absorbed.

In a further aspect, an integrated optical filter includes one or more diffusion barrier layers to prevent degradation of the integrated optical filter by the external environment, prevent diffusion between the integrated optical filter and other material layers, or both. In many embodiments, a thin diffusion barrier layer effectively increases the lifetime of a multilayer optic without affecting its optical performance.

In another aspect, the thicknesses of the one or more layers of an integrated optical filter vary over the spatial area of the filter.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
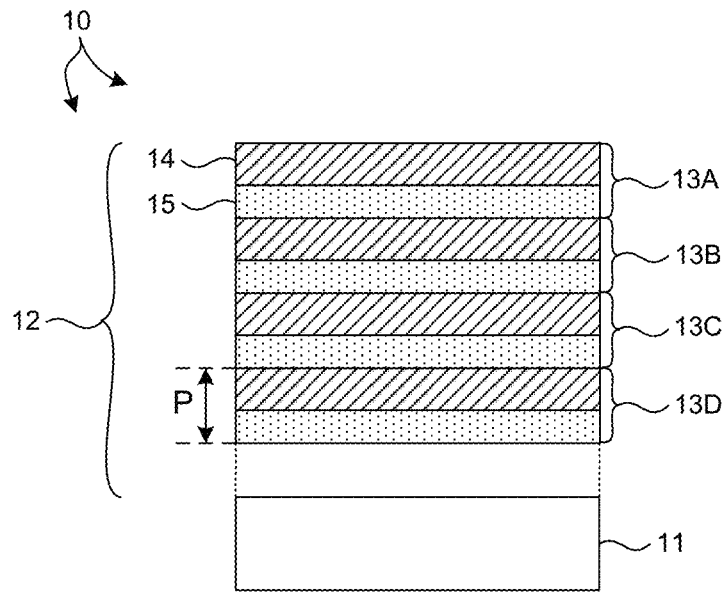
FIG. 1 depicts an illustration of a cross-sectional view of a multilayer optic 10 used in soft x-ray applications.
Figure 2:
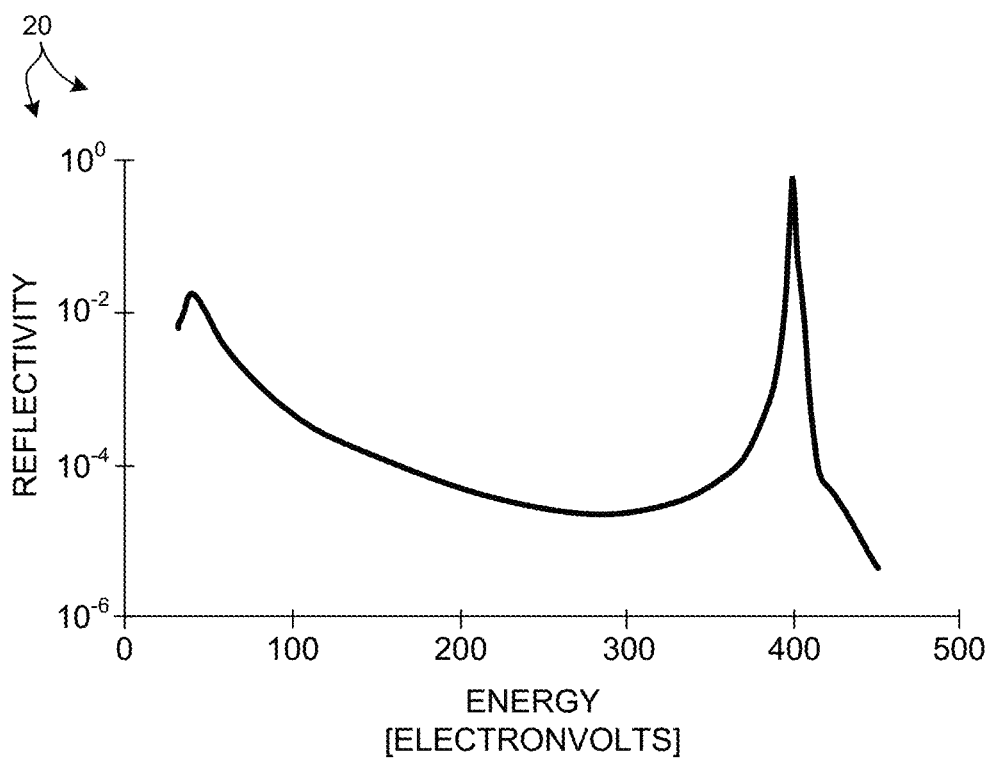
FIG. 2 is a plot 20 illustrative of a simulation of the reflectivity of multilayer optic 10 as a function of beam energy for an angle of incidence of five degrees.

Reference will now be made in detail to background examples and some embodiments of the invention, examples of which are illustrated in the accompanying drawings.

Optical elements that efficiently propagate x-ray radiation over a desired energy range and reject radiation outside the desired energy range are presented herein. In addition, x-ray based metrology systems including optical elements that efficiently propagate x-ray radiation over a desired energy range and reject radiation outside the desired energy range are also presented. In particular, broadband, soft x-ray based metrology systems employ optical elements that propagate broadband, soft x-ray radiation and reject wavelengths in the EUV, UV, visible, IR, or any combination thereof.

In one aspect, one or more optical elements of an x-ray based system include an integrated optical filter including one or more material layers that absorb radiation having energy below the desired energy band. In some embodiments, the integrated optical filter absorbs radiation having wavelengths above 10 nanometers (i.e., less than 123.9 electronvolts). In some embodiments, the integrated optical filter absorbs radiation having wavelengths above 13.7 nanometers (i.e., less than 90 electronvolts). In some embodiments, the integrated optical filter absorbs radiation having wavelengths above 12.4 nanometers (i.e., less than 100 electronvolts). In some embodiments, the integrated optical filter absorbs radiation having wavelengths above 10.3 nanometers (i.e., less than 120 electronvolts). In general, the integrated filter improves the optical performance of an x-ray based system by suppressing reflectivity within infrared (IR), visible (vis), ultraviolet (UV), extreme ultraviolet (EUV) portions of the spectrum, or any other undesired wavelength region.

By way of non-limiting example, one or more optical elements of an x-ray metrology system, a projection lithography system, a microscopy system, an astronomical system, a spectroscopic system, a laser illumination source including laser cavities and optics, a synchrotron illumination source, etc., include an integrated optical filter to absorb undesired radiation.

In some embodiments, a multilayer X-ray reflecting optic includes an integrated optical filter including one or more material layers that absorb radiation having energy below the desired energy band. The integrated optical filter may include a single material layer, two material layers, or more than two material layers depending on the desired wavelength range or wavelength ranges to be absorbed. Typically, the thickness of each layer is selected for optimal π phase-matching, i.e., 180 degree phase matching, to maximize extinction at over the range of photon energy to be suppressed. The thickness of each material layer usually lies in a range between one and one hundred nanometers.

For an integrated optical filter including a single material layer disposed on top of a set of repeated pairs of reflective multilayer coatings, an optical refractive index, $n_{filter}$, and thickness, $t_{filter}$, of the single material layer may be approximated by equations (1) and (2), where $n_{top}$ is the index of refraction of the top layer of the underlying set of repeated pairs of reflective multilayer coatings, $\theta$, is the angle of incidence of the incident beam, and $\lambda$ is the wavelength of the incident beam.

$$n_{filter} = \sqrt{n_{top}} \quad (1)$$

$$t_{filter} = \frac{\lambda \cos(\theta)}{4} \quad (2)$$

In practice, a selection of material and deposition thickness for an integrated optical filter is guided by performing a series of thickness optimizations for a variety of materials guided by equations (1) and (2). For example, the complexity of a multilayer structure may shift the optimal thickness to achieve an optimal extinction valley away from the thickness estimate made by Equation (2). In addition, it is also challenging to identify a material that can be effectively deposited in a thin layer that perfectly matches the requirement of Equation (1). Thus, in practice, equation (1) helps to narrow the list of candidate materials, and equation (2) offers a good starting point for thickness optimization.

In addition, it is rare that out of band contamination (e.g., EUV contamination) lies within a sharp wavelength band. Thus, the selection and thickness optimization of a single material layer will often involve compromises regarding out of band absorption. If these compromises render the single layer filter ineffective, one or more additional layers of different material(s) should be considered.

Figure 3:
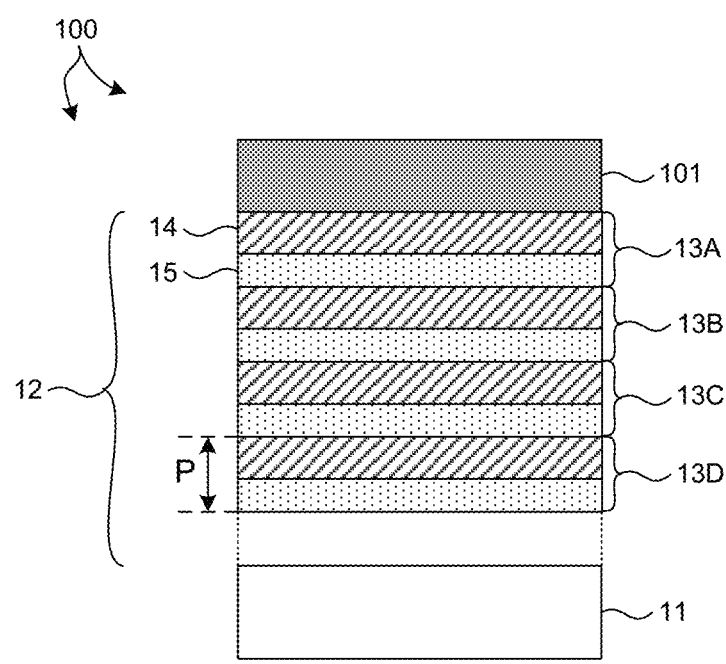
FIG. 3 depicts a multilayer X-ray reflecting optic 100 including an integrated optical filter 101 in one embodiment.

FIG. 3 depicts a multilayer X-ray reflecting optic 100 including an integrated optical filter 101. Like numbered elements depicted in FIG. 3 are analogous to those described with reference to FIG. 1. As depicted in FIG. 3, integrated optical filter 101 includes a material layer explicitly fabricated on top of the set of repeated pairs of multilayer coatings 12. In one example, integrated optical filter 101 is a silicon dioxide ($SiO_2$) layer deposited on top of chromium absorber layer 14.

Figure 4:
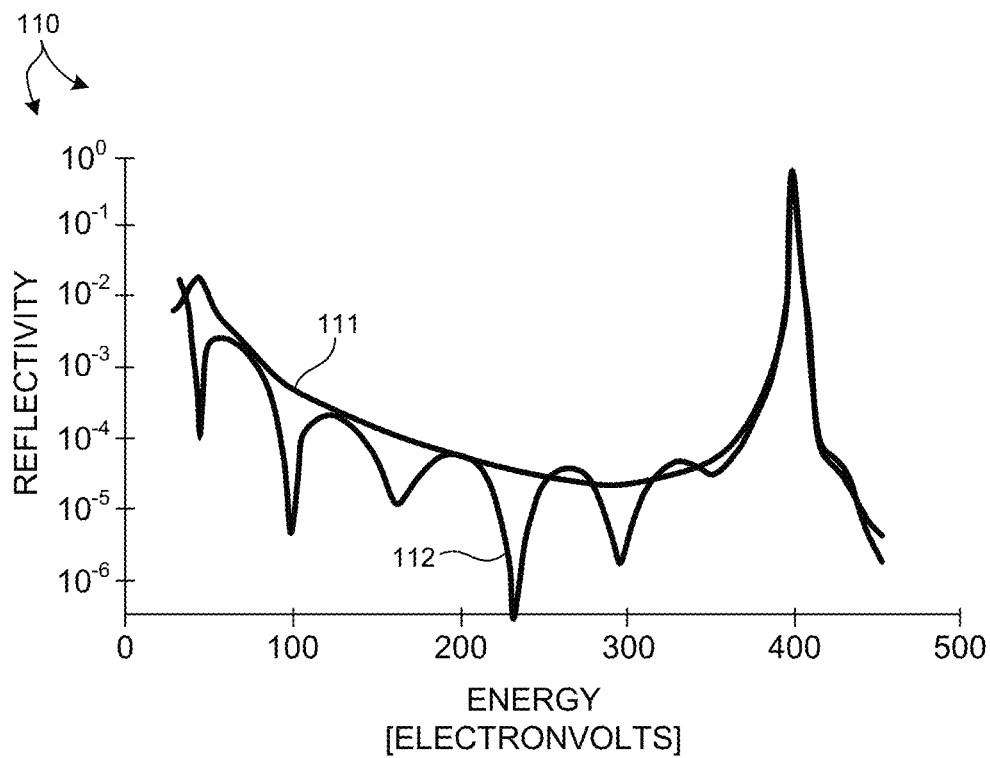
FIG. 4 depicts a plot 110 illustrative of a simulation of the reflectivity of multilayer x-ray reflecting optic 100 depicted in FIG. 3.

FIG. 4 depicts a plot 110 illustrative of a simulation of the reflectivity of multilayer x-ray reflecting optic 100 depicted in FIG. 3. Plotline 111 depicts the reflectivity of multilayer x-ray reflecting optic 100 as a function of beam energy without integrated optical filter 101. Plotline 112 depicts the reflectivity of multilayer x-ray reflecting optic 100 as a function of beam energy with an integrated optical filter 101 having a single layer of $SiO_2$ with a thickness of 10 nanometers. As illustrated in FIG. 4, the integrated optical filter 101 eliminates 99.3% of the radiation at 41.6 eV, and only absorbs 5.4% of the radiation at the wavelength of interest (397.9 eV). Over a contamination band from 30 eV to 130 eV, the integrated optical filter decreases average reflectivity by a factor of eight compared to the unfiltered scenario.

Figure 5:
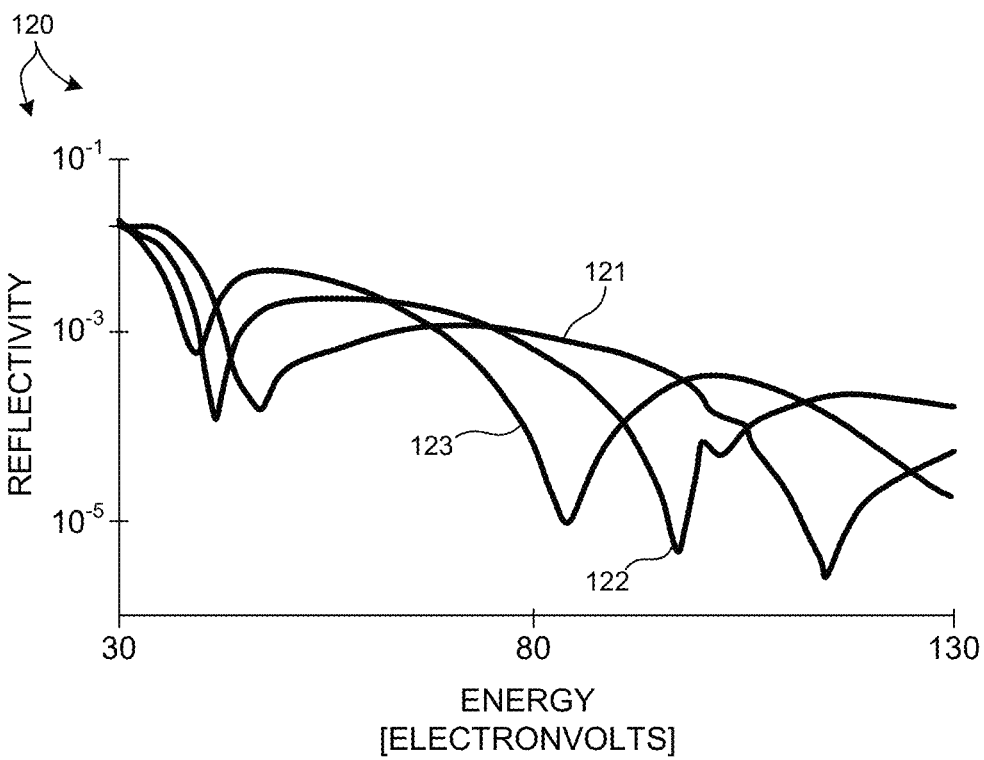
FIG. 5 depicts a plot 120 illustrative of a simulation of the reflectivity of multilayer x-ray reflecting optic 100 depicted in FIG. 3 for different thicknesses of an integrated optical filter.

FIG. 5 depicts a plot 120 illustrative of a simulation of the reflectivity of multilayer x-ray reflecting optic 100 depicted in FIG. 3 for different thicknesses of an integrated optical filter. Plotline 121 depicts a simulation of reflectivity of multilayer x-ray reflecting optic 100 with an integrated optical filter 101 having a single layer of $SiO_2$ with a thickness of 8 nanometers. Plotline 122 depicts a simulation of reflectivity of multilayer x-ray reflecting optic 100 with an integrated optical filter 101 having a single layer of $SiO_2$ with a thickness of 10 nanometers. Plotline 123 depicts a simulation of reflectivity of multilayer x-ray reflecting optic 100 with an integrated optical filter 101 having a single layer of $SiO_2$ with a thickness of 12 nanometers. As the thickness changes from 8 nanometers to 12 nanometers, the first extinction valley shifts from 47.0 eV (26.4 nanometers) to 39.1 eV (31.7 nanometers). In addition, the second extinction valley shifts from 115.1 eV (10.8 nanometers) to 83.9 eV (14.8 nanometers). In this manner, the stopband of integrated optical filter 101 is tuned by adjusting its thickness.

In some embodiments, the bandwidth of a single-layer integrated optical filter is too narrow to sufficiently suppress the range of contamination wavelengths of interest. In these embodiments, an integrated optical filter having two layers, or more than two layers is employed. In some embodiments, a multiple layer integrated optical filter may absorb less radiation at the desired wavelengths of x-ray system operation.

In general, the order of layers of the multiple layer integrated optical filter may be arbitrary. However, in preferred embodiments, the material layer of the multiple layer integrated optical filter that best matches the refractive index of air (e.g., smaller delta and beta) is disposed on top of the multiple layer stack to allow more radiation through the air/layer interface.

Figure 6:
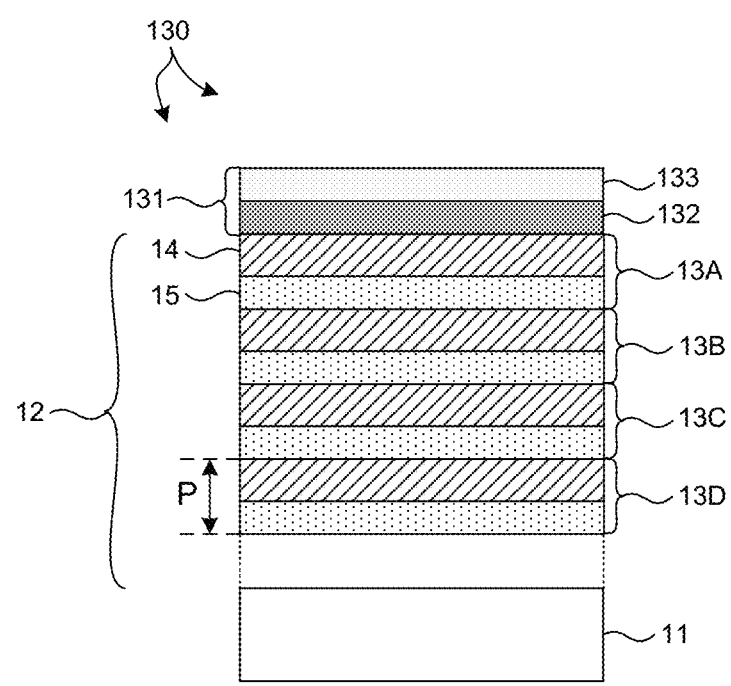
FIG. 6 depicts a multilayer X-ray reflecting optic 130 including an integrated optical filter 131 in one embodiment.

FIG. 6 depicts a multilayer X-ray reflecting optic 130 including an integrated optical filter 131. Like numbered elements depicted in FIG. 6 are analogous to those described with reference to FIG. 1. As depicted in FIG. 6, integrated optical filter 131 includes two material layers 132 and 133 explicitly fabricated on top of the set of repeated pairs of multilayer coatings 12. In one example, layer 132 is a silicon dioxide ($SiO_2$) layer deposited on top of chromium absorber layer 14, and layer 133 is a Tellurium (Te) layer deposited on top of $SiO_2$ layer 132. Te layer 133 is deposited on top because it has significantly smaller delta and beta values compared to $SiO_2$ below 60 eV. Integrated optical filter 131 is preferred in x-ray systems where contamination is mainly focused within a range of photon energy from 30 eV to 60 eV.

Figure 7:
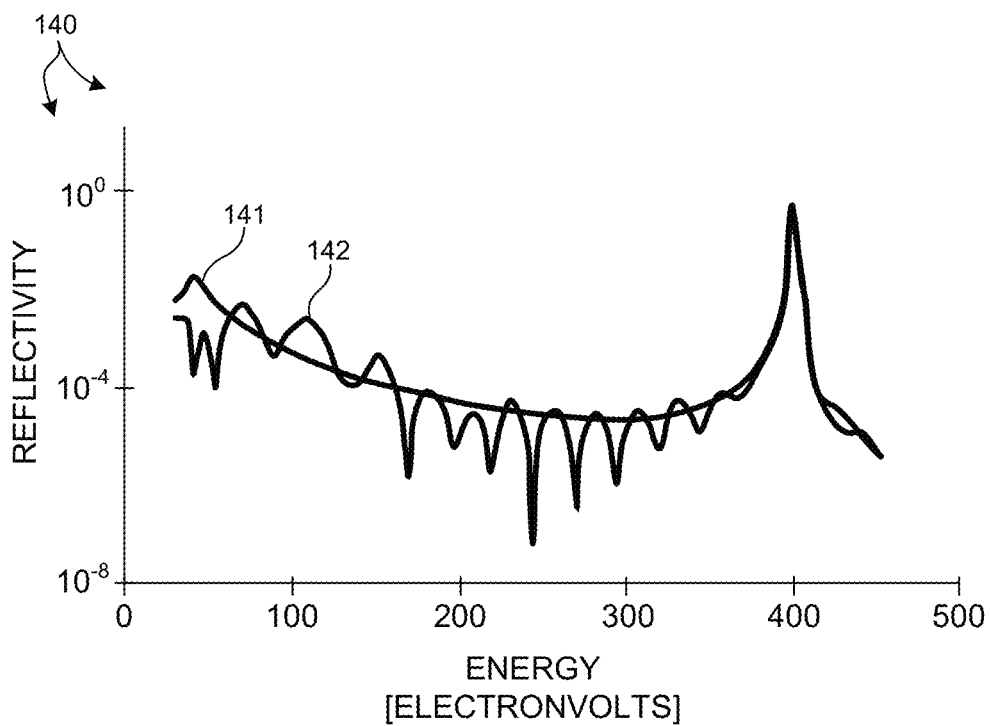
FIG. 7 depicts a plot 140 illustrative of a simulation of the reflectivity of multilayer x-ray reflecting optic 130 depicted in FIG. 6.

FIG. 7 depicts a plot 140 illustrative of a simulation of the reflectivity of multilayer x-ray reflecting optic 130 depicted in FIG. 6. Plotline 141 depicts the reflectivity of multilayer x-ray reflecting optic 130 as a function of photon energy without integrated optical filter 131. Plotline 142 depicts the reflectivity of multilayer x-ray reflecting optic 100 as a function of photon energy with an integrated optical filter 131 having a layer 132 of $SiO_2$ with a thickness of 10.5 nanometers and a layer 133 of Te with a thickness of 14.4 nanometers. As illustrated in FIG. 7, the integrated optical filter 131 has a much wider stopband compared to integrated optical filter 101 illustrated in FIG. 4. Integrated optical filter 131 includes three extinction valleys below 60 eV. In addition, integrated optical filter 131 only absorbs 13.8% of the radiation at the wavelength of interest (397.9 eV) compared to the unfiltered scenario.

Figure 8:
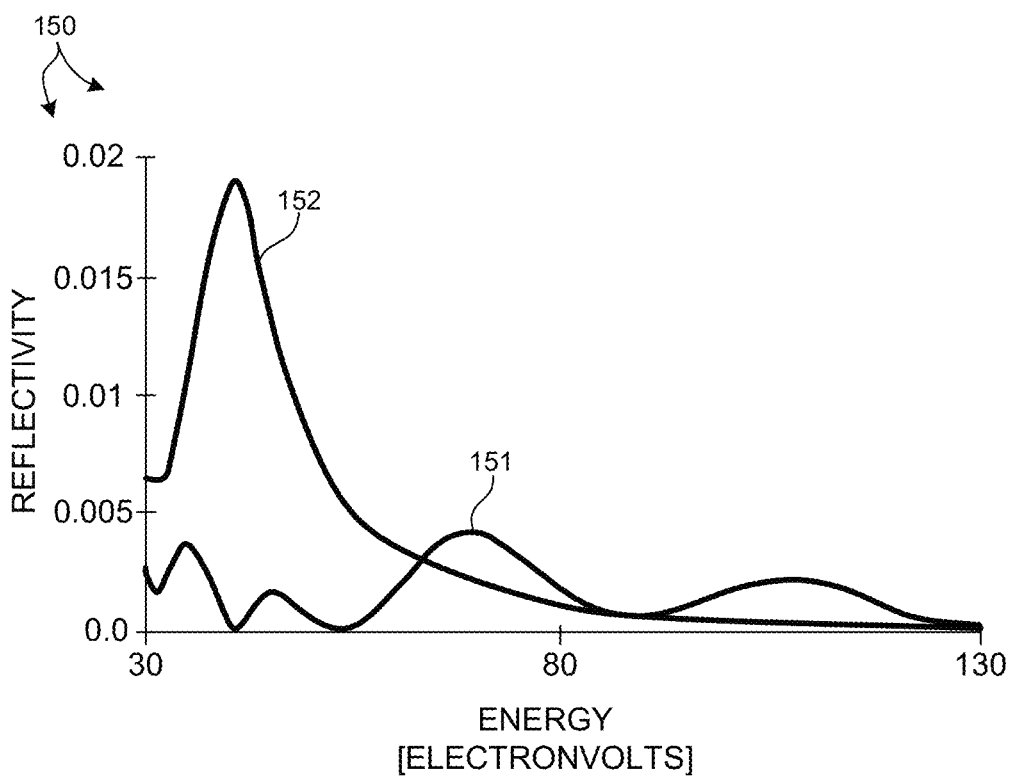
FIG. 8 depicts a plot 150 illustrative of the simulation of the reflectivity of multilayer x-ray reflecting optic 130 depicted in FIG. 7 over a contamination band from 30 eV to 130 eV.

FIG. 8 depicts a plot 150 illustrative of the simulation of the reflectivity of multilayer x-ray reflecting optic 130 depicted in FIG. 7 over a contamination band from 30 eV to 130 eV. As depicted in FIG. 8, peak extinction occurs at 41.2 eV, where 98.9% of photon energy is absorbed. Integrated optical filter 130 decreases average reflectivity by a factor of seventeen compared to the unfiltered scenario over a contamination band of interest from 30 eV to 60 eV.

Figure 9:
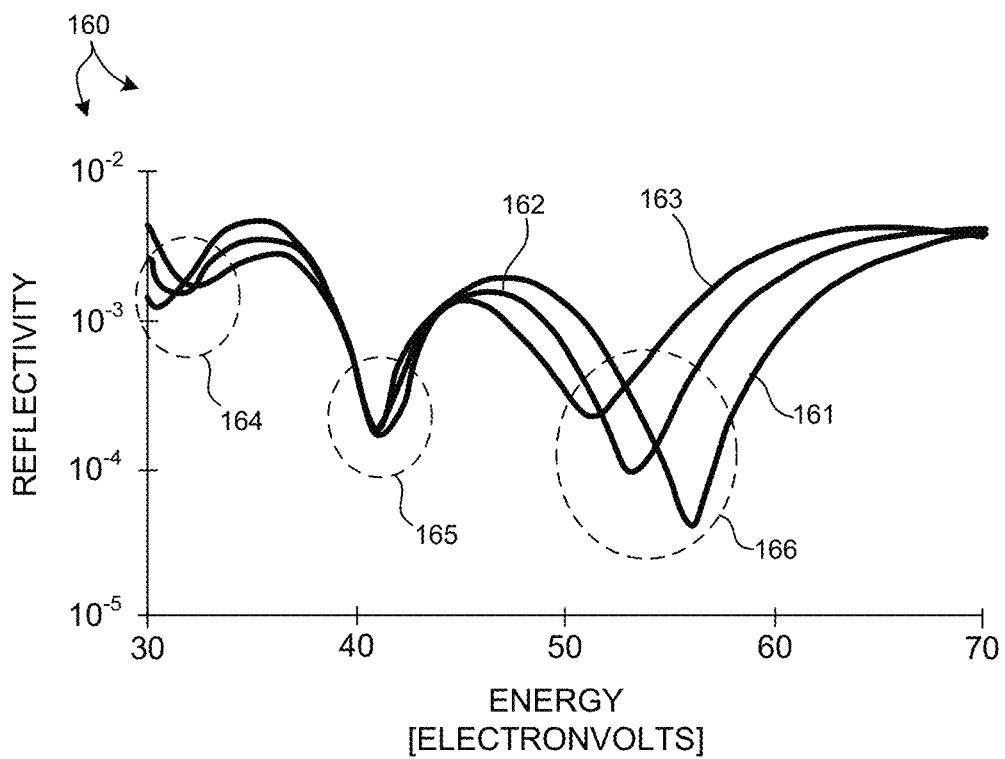
FIG. 9 depicts a plot 160 illustrative of a simulation of the reflectivity of multilayer x-ray reflecting optic 130 depicted in FIG. 6 over a photon energy band from 30 eV to 70 eV for various thicknesses of Te layer 133 and a constant thickness of 10.5 nanometers for $SiO_2$ layer 132.

FIG. 9 depicts a plot 160 illustrative of a simulation of the reflectivity of multilayer x-ray reflecting optic 130 depicted in FIG. 6 over a photon energy band from 30 eV to 70 eV for various thicknesses of Te layer 133 and a constant thickness of 10.5 nanometers for $SiO_2$ layer 132. Plotline 161 depicts reflectivity of multilayer x-ray reflecting optic 130 with Te layer 133 having a thickness of 13.4 nanometers. Plotline 162 depicts reflectivity of multilayer x-ray reflecting optic 130 with Te layer 133 having a thickness of 14.4 nanometers. Plotline 163 depicts reflectivity of multilayer x-ray reflecting optic 130 with Te layer 133 having a thickness of 15.4 nanometers.

Figure 10:
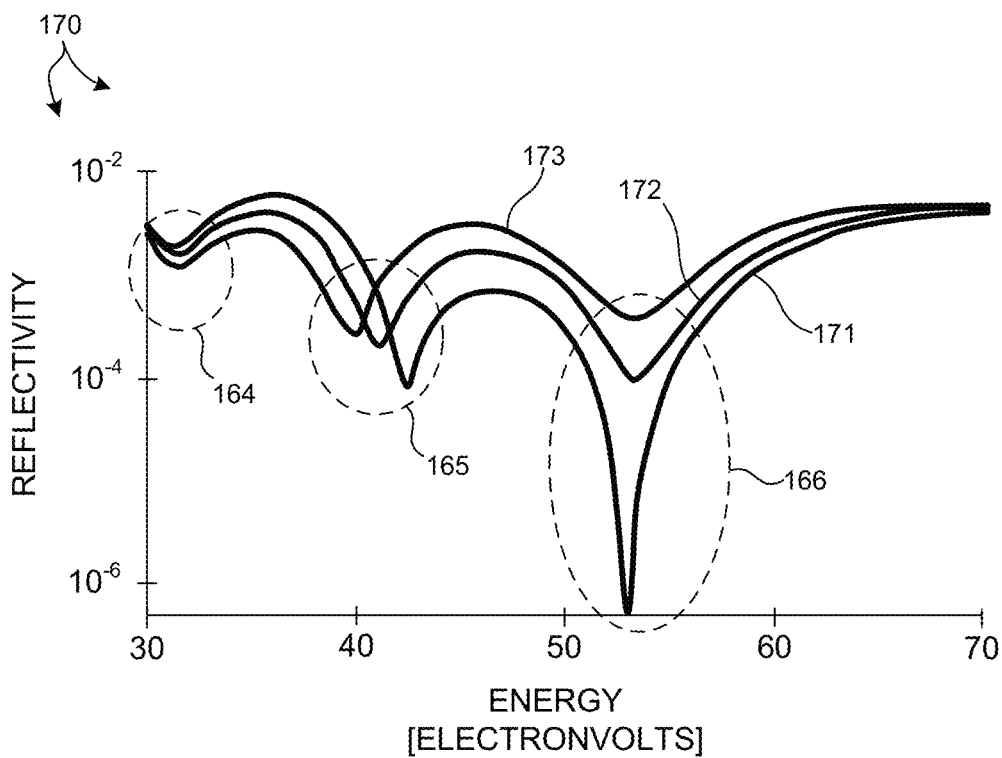
FIG. 10 depicts a plot 170 illustrative of a simulation of the reflectivity of multilayer x-ray reflecting optic 130 depicted in FIG. 6 over a photon energy band from 30 eV to 70 eV for various thicknesses of $SiO_2$ layer 132 and a constant thickness of 14.4 nanometers for Te layer 133.

FIG. 10 depicts a plot 170 illustrative of a simulation of the reflectivity of multilayer x-ray reflecting optic 130 depicted in FIG. 6 over a photon energy band from 30 eV to 70 eV for various thicknesses of $SiO_2$ layer 132 and a constant thickness of 14.4 nanometers for Te layer 133. Plotline 171 depicts reflectivity of multilayer x-ray reflecting optic 130 with $SiO_2$ layer 132 having a thickness of 9.5 nanometers. Plotline 172 depicts reflectivity of multilayer x-ray reflecting optic 130 with $SiO_2$ layer 132 having a thickness of 10.5 nanometers. Plotline 173 depicts reflectivity of multilayer x-ray reflecting optic 130 with $SiO_2$ layer 132 having a thickness of 11.5 nanometers. As illustrated in FIGS. 9 and 10, changing the thickness of Te layer 133 affects the location of the $1^{st}$ extinction valley 164 and $3^{rd}$ extinction valley 166, whereas changing the thickness of $SiO_2$ layer 132 shifts the location of the 2nd extinction valley 165.

Figures 11, 12:
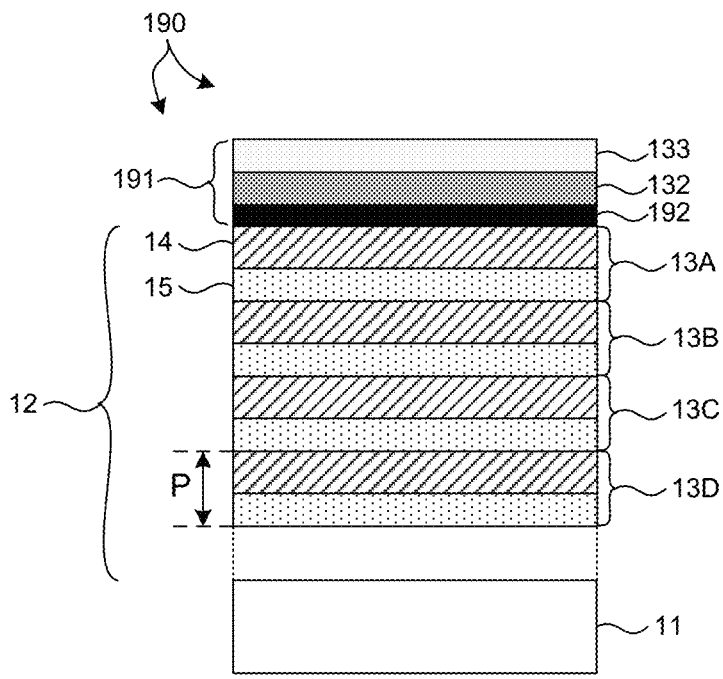
FIG. 11 depicts an illustration of a table 180 summarizing the average reflectivity of multilayer x-ray reflecting optic 130 depicted in FIG. 6 over three different contamination bands and reflectivity at a soft X-ray wavelength of interest (397.9 eV) for the different combinations of Te and $SiO_2$ layer thicknesses illustrated in FIGS. 9 and 10.
FIG. 12 depicts a multilayer X-ray reflecting optic 190 including an integrated optical filter 191.

FIG. 11 depicts an illustration of a table 180 summarizing the average reflectivity of multilayer x-ray reflecting optic 130 depicted in FIG. 6 over three different contamination bands and reflectivity at a soft X-ray wavelength of interest (397.9 eV) for the different combinations of Te and $SiO_2$ layer thicknesses illustrated in FIGS. 9 and 10. In one example, the output spectrum of the illumination source of an x-ray system dictates the contamination waveband where maximum suppression is desired. Table 180 is used to select the best combination of film thicknesses to suppress photon energy within the identified contamination waveband.

In some embodiments, an X-ray optical element is designed to support multiple wavelengths of interest. In some of these embodiments, the integrated optical filter includes a single layer or multi-layer combination optimized over all of the wavelengths of interest. In some other embodiments, the integrated optical filter includes multiple single layers or multiple multi-layer combinations each optimized over a different portion of all of the wavelengths of interest, and each optimized to suppress at least one contamination band.

In a further aspect, an integrated optical filter includes one or more diffusion barrier layers to prevent degradation of the integrated optical filter by the external environment, prevent diffusion between the integrated optical filter and other material layers, or both. In many embodiments, a thin diffusion barrier layer effectively increases the lifetime of a multilayer optic without affecting its optical performance.

FIG. 12 depicts a multilayer X-ray reflecting optic 190 including an integrated optical filter 191. Like numbered elements depicted in FIG. 12 are analogous to those described with reference to FIGS. 1 and 6. As depicted in FIG. 12, integrated optical filter 191 includes a diffusion barrier layer 192 deposited on top of chromium absorber layer 14 and under $SiO_2$ layer 132. In this embodiment, diffusion barrier layer 192 prevents oxygen and water from degrading the set of repeated pairs of multilayer coatings 12, and also protects the set of repeated pairs of multilayer coatings 12 from diffusing into $SiO_2$ layer 132 and Te layer 133. In another embodiment, diffusion barrier layer 192 is deposited on top of $SiO_2$ layer 132 and under Te layer 133. In yet another embodiment, diffusion barrier layer 192 is deposited on top of Te layer 133. In these embodiments, diffusion barrier layer 192 prevents oxygen and water from degrading the set of repeated pairs of multilayer coatings 12. In general, one or more diffusion barrier layers may be deposited anywhere in the stack of an integrated optical filter.

In general, an integrated optical filter may be located anywhere in the stack of a multiple layered optical element. In some embodiments, an integrated optical filter is located on top of the layer stack of a multilayer X-ray reflecting optic as illustrated in FIGS. 3, 6, and 12. In some other embodiments, an integrated optical filter is located below a set of repeated pairs of multilayer coatings (e.g., between the set of repeated pairs of multilayer coatings 12 and substrate 11) in the layer stack of a multilayer X-ray reflecting optic.

In some embodiments, one or more of the layers of an integrated optical filter are fabricated from chemically inert materials to improve stability and lifetime of the optical element. In these embodiments, the integrated optical filter is located on top of the layer stack of a multilayer X-ray reflecting optic, separating the set of repeated pairs of multilayer coatings from the external environment. In this manner, the integrated optical filter also acts as a protective layer that prevents contamination of the repeated pairs of multilayer coatings by the surrounding environment.

By way of non-limiting example, materials that are both chemically inert and suitable candidates for one or more layers of an integrated optical filter include pure elements (e.g. tellurium, carbon, magnesium) and compounds (e.g. boron carbide ($B_4C$), silicon nitride ($Si_3N_4$), silicon oxide ($SiO_2$)). These materials can be deposited in thin layers on top of multilayer reflective coatings by various deposition techniques, such as sputtering. In addition, the deposition of these material layers can be performed directly by the fabrication tool employed to fabricate the multilayer reflective coatings (e.g., magnetron sputtering tool).

In another aspect, the thicknesses of the one or more layers of an integrated optical filter vary over the spatial area of the filter. In some embodiments, an x-ray optical element is curved and the one or more layers of an integrated optical filter have gradient thickness that tracks the incidence angle along the curved optic such that the incident light has the same path length through the absorbing material regardless of location of incidence along the curved optic. In this manner, the suppression efficiency of the integrated optical element is uniform along the entire optical surface.

Figure 13:
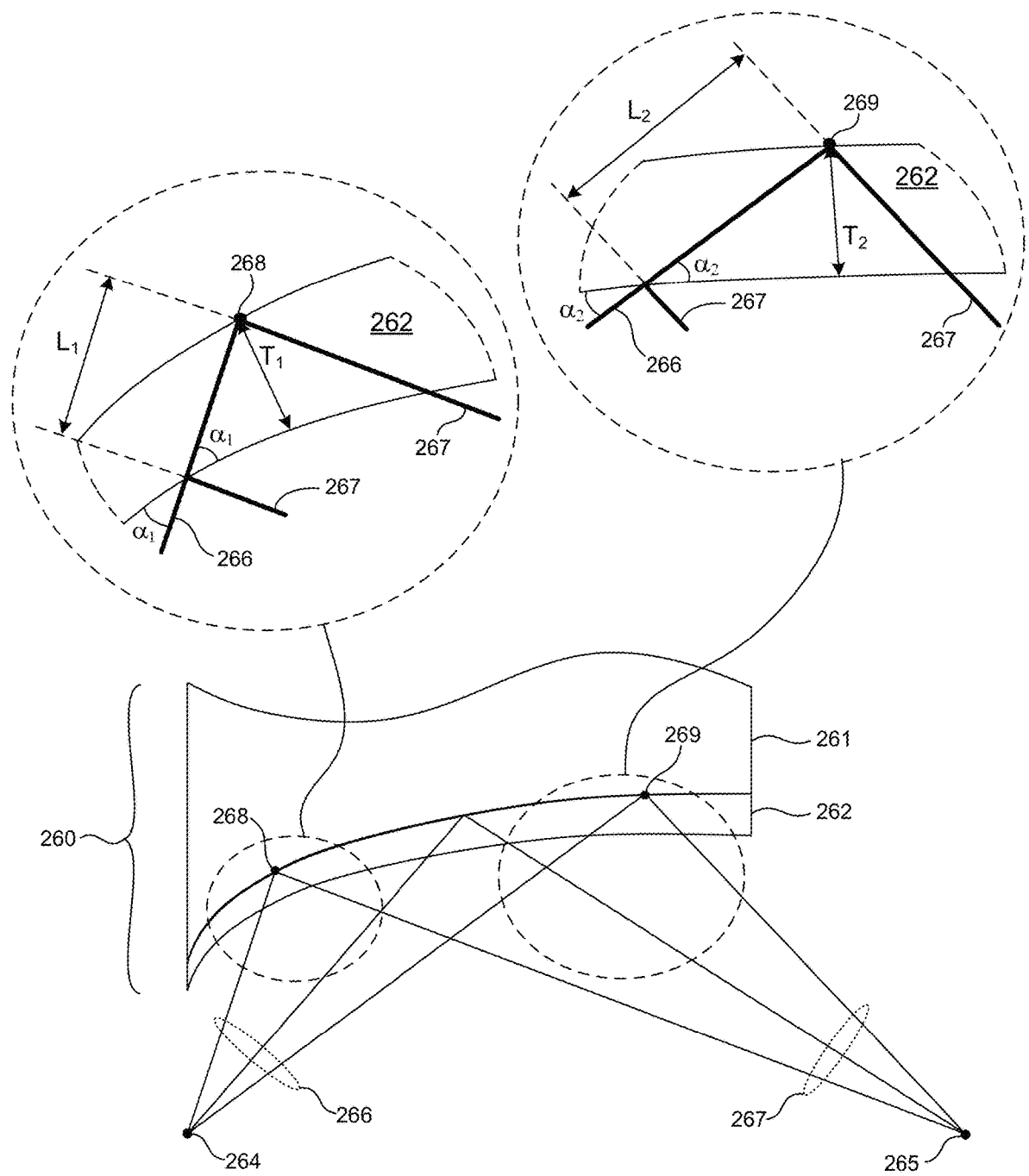
FIG. 13 depicts a curved optical element 260 including an integrated optical filter 262 disposed on the surface of the curved optical element.

FIG. 13 depicts a curved optical element 260 including an integrated optical filter 262 disposed on the surface of the curved optical element. Incident light 266 from a source 264 reflects from curved optical element 260. The reflected light 267 is focused to a focal area 265 by curved optical element 260. Incident light 266 is incident on the surface of curved optical element 260 over a relatively large area. In other words, different portions of the incident beam reflect from different locations on the surface of curved optical element 260 having significantly different curvature. For example, light incident at point 268 is incident to the surface of curved optical element 260 at an angle, $\alpha_1$, and light incident at point 269 is incident at a different angle, $\alpha_2$. As depicted in FIG. 13, the light incident at point 268 traverses a path length, $L_1$, through integrated optical filter 262. The path length, $L_1$, is related to the angle of incidence, a, and the thickness, $T_1$, of the integrated optical element 262 at point 268 as described by equation (3).

$$L_1 = \frac{T_1}{\sin(\alpha_1)} \quad (3)$$

Also, as depicted in FIG. 13, the light incident at point 269 traverses a path length, $L_2$, through integrated optical filter 262. The path length, $L_2$, is related to the angle of incidence, $\alpha_2$, and the thickness, $T_2$, of the integrated optical element 262 at point 269 as described by equation (4).

$$L_2 = \frac{T_2}{\sin(\alpha_2)} \quad (4)$$

In the depicted embodiment, the thickness, $T_1$, of integrated filter element 262 at point 268 and the thickness of integrated filter element 262 at point 269 are selected to maintain the same path length through integrated optical filter 262 at both locations in accordance with equation (5).

$$\frac{T_1}{\sin(\alpha_1)} = \frac{T_2}{\sin(\alpha_2)} \quad (5)$$

X-ray based metrology systems are employed to measure structural and material characteristics (e.g., material composition, dimensional characteristics of structures and films, etc.) of semiconductor structures associated with different semiconductor fabrication processes based on x-ray illumination.

In some embodiments, an x-ray based metrology system performs measurements of semiconductor structures based on high-brightness, polychromatic reflective small angle x-ray scatterometry (RSAXS). Further description is provided in U.S. Patent Publication No. 2019/0017946 by Wack et al., the content of which is incorporated herein by reference in its entirety.

RSAXS measurements of a semiconductor wafer are performed over a range of wavelengths, angles of incidence, and azimuth angles with a small beam spot size (e.g., less than 50 micrometers across the effective illumination spot). In one aspect, RSAXS measurements are performed with x-ray radiation in the soft x-ray (SXR) region (i.e., 80-3000 eV) at grazing angles of incidence in the range of 5-20 degrees. Grazing angles for a particular measurement application are selected to achieve a desired penetration into the structure under measurement and maximize measurement information content with a small beam spot size (e.g., less than 50 micrometers).

Figure 14:
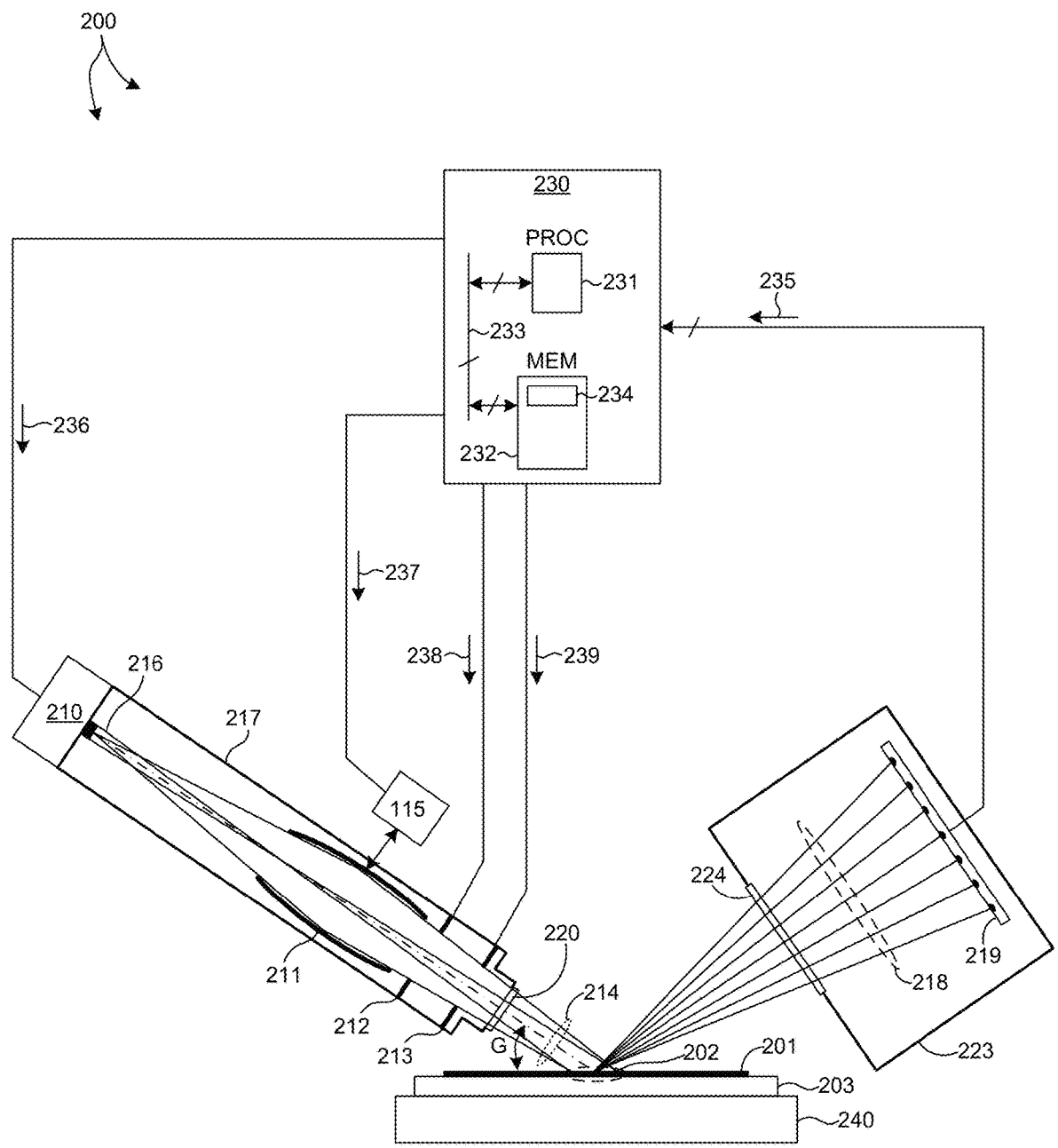
FIG. 14 illustrates an embodiment of a RSAXS metrology tool 200 for measuring characteristics of a specimen in at least one novel aspect.

FIG. 14 illustrates an embodiment of a RSAXS metrology tool 200 for measuring characteristics of a specimen. As shown in FIG. 14, the system 100 may be used to perform RSAXS measurements over a measurement area 202 of a specimen 201 illuminated by an incident illumination beam spot.

In the depicted embodiment, metrology tool 200 includes an x-ray illumination source 210, focusing optics 211, beam divergence control slit 212, and slit 213. The x-ray illumination source 210 is configured to generate SXR radiation suitable for RSAXS measurements. X-ray illumination source 210 is a polychromatic, high-brightness, large etendue source. In some embodiments, the x-ray illumination source 210 is configured to generate x-ray radiation in a range between 80-3000 electron-volts. In general, any suitable high-brightness x-ray illumination source capable of generating high brightness SXR at flux levels sufficient to enable high-throughput, inline metrology may be contemplated to supply x-ray illumination for RSAXS measurements.

By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 210.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 210 is a high harmonic generation (HHG) x-ray source. In some other embodiments, illumination source 210 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some other embodiments, illumination source 210 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant S×R regions. For example, plasma emitted by Krypton provides high brightness at the Silicon K-edge. In another example, plasma emitted by Xenon provides high brightness throughout the entire S×R region of (80-3000 eV). As such, Xenon is a preferred choice of emitting material when broadband SXR illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. Patent Publication No. 2019/0215940, the content of which is incorporated herein by reference in its entirety.

In a further aspect, the wavelengths emitted by the illumination source (e.g., illumination source 210) are selectable. In some embodiments, illumination source 210 is a LPP light source controlled by computing system 230 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation. As depicted in FIG. 14, computing system 230 communicates command signals 236 to illumination source 210 that cause illumination source 210 to adjust the spectral range of wavelengths emitted from illumination source 210. In one example, illumination source 210 is a LPP light source, and the LPP light source adjusts any of a pulse duration, pulse frequency, and target material composition to realize a desired spectral range of wavelengths emitted from the LPP light source.

X-ray illumination source 210 produces x-ray emission over a source area having finite lateral dimensions (i.e., non-zero dimensions orthogonal to the beam axis. In one aspect, the source area of illumination source 210 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In general, x-ray optics shape and direct x-ray radiation to specimen 201. In some examples, the x-ray optics collimate or focus the x-ray beam onto measurement area 202 of specimen 201 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof.

Further details are described in U.S. Patent Publication No. 2015/0110249, the content of which is incorporated herein by reference it its entirety.

As depicted in FIG. 14, focusing optics 211 focuses source radiation onto a metrology target located on specimen 201. The finite lateral source dimension results in finite spot size 202 on the target defined by the rays 216 coming from the edges of the source and any beam shaping provided by beam slits 212 and 213. In some embodiments, a multilayer x-ray optical element of an x-ray based metrology system, such as focusing optical element 211 of RSAXS system 200, includes an integrated optical filter as described herein.

In some embodiments, focusing optics 211 includes elliptically shaped focusing optical elements. In the embodiment depicted in FIG. 14, the magnification of focusing optics 211 at the center of the ellipse is approximately one. As a result, the illumination spot size projected onto the surface of specimen 201 is approximately the same size as the illumination source, adjusted for beam spread due to the nominal grazing incidence angle (e.g., 5-20 degrees).

In a further aspect, focusing optics 211 collect source emission and select one or more discrete wavelengths or spectral bands, and focus the selected light onto specimen 201 at grazing angles of incidence in the range 5-20 degrees. The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility RSAXS measurements probe more deeply into the structure with less sensitivity to the precise value of the grazing incidence angle.

In some embodiments, focusing optics 211 include graded multi-layers that select desired wavelengths or ranges of wavelengths for projection onto specimen 201. In some examples, focusing optics 211 includes a graded multi-layer structure (e.g., layers or coatings) including an integrated optical filter that selects one wavelength and projects the selected wavelength onto specimen 201 over a range of angles of incidence. In some examples, focusing optics 211 includes a graded multi-layer structure including an integrated optical filter that selects a range of wavelengths and projects the selected wavelengths onto specimen 201 over one angle of incidence. In some examples, focusing optics 211 includes a graded multi-layer structure including an integrated optical filter that selects a range of wavelengths and projects the selected wavelengths onto specimen 201 over a range of angles of incidence.

Graded multi-layered optics including an integrated optical filter are preferred to minimize loss of light that occurs when single layer grating structures are too deep. In general, multi-layer optics select reflected wavelengths. The spectral bandwidth of the selected wavelengths optimizes flux provided to specimen 201, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics including an integrated optical filter select wavelengths to enhance contrast and information content of diffraction signals from specific material interfaces or structural dimensions, and suppress contamination wavelengths, such as wavelengths greater than 10 nanometers. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some other examples, little to no prior structural information is available at the time of measurement. In these examples, multiple wavelengths (e.g., 3-4) are selected to enable measurement of diffraction patterns across the absorption edge. The measured signals enable model-free measurement of structural properties with no prior information except the elemental composition of the structures under measurement using, for example, multiple wavelength anomalous diffraction techniques. After estimating structural properties based on model-free measurements, parameter estimates may be further refined using model-based measurement techniques.

In some examples, the anomalous scattering factors (i.e., scattering properties) of the metrology target under measurement are not known apriori. In these examples, film multilayer reflectivity is measured at multiple resonant wavelengths. Angular excursions of Bragg peaks provide sufficient information to extract the anomalous scattering factors.

In some examples, non-resonant x-ray reflectivity measurements provide independent estimates of multilayer period and interface roughness parameters, which improve the fitting of model-based measurements. In some embodiments, a combined metrology tool includes a multiple wavelength SXR diffraction subsystem as described herein and an x-ray reflectometry subsystem to improve measurement throughput. In one embodiment, the multiple wavelength SXR diffraction subsystem and the x-ray reflectometry subsystem employ orthogonal planes of incidence that enable simultaneous measurements or sequential measurements without having to move the specimen under measurement or either of the optical measurement subsystems. In some embodiments, wafer rotation, detector rotation, or both, may be employed to extend the range of angles of incidence if the AOI range provided by the SXR multilayer mirrors is too small for x-ray reflectometry.

In some embodiments, focusing optics 211 include a plurality of reflective optical elements each having an elliptical surface shape. Each reflective optical element includes a substrate and a multi-layer coating and integrated optical filter tuned to reflect a different wavelength or range of wavelengths and suppress a different wavelength or range of wavelengths.

Figure 15:
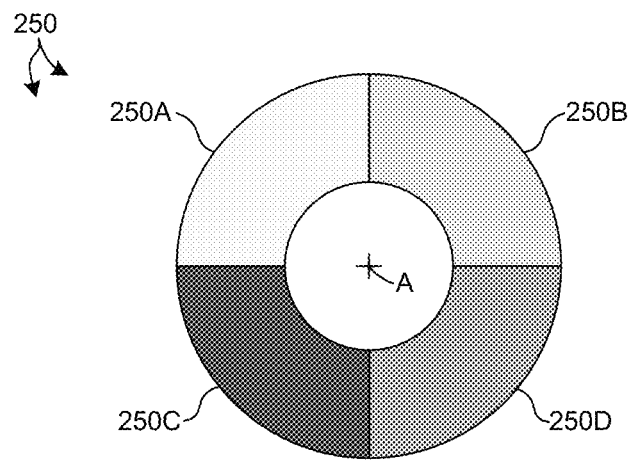
FIG. 15 is a simplified diagram illustrative of an end view of focusing optics including four mirror elements disposed around the beam axis, A, in a segmented toroidal configuration.

In some embodiments, focusing optics 211 focus light at multiple wavelengths, azimuths and AOI on the same metrology target area. FIG. 15 depicts an end view (i.e., along the beam axis) of focusing optics 250 including four mirror elements 250A-250D disposed around the beam axis, A, in a segmented toroidal configuration. Each mirror element includes a multi-layer coating tuned to reflect a different wavelength or range of wavelengths and an integrated optical filter tuned to suppress a different wavelength or range of wavelengths. In some embodiments, each mirror element 250A-D includes a uniform multilayer design (i.e., the surface of a particular mirror element reflects the same wavelength or range of wavelengths over the entire mirror surface area of that particular mirror element). In some other embodiments, each mirror element includes a non-uniform multilayer design (i.e., the wavelength or range of wavelengths reflected by the mirror element depends on the location of incidence on the mirror surface). In some of these embodiments, each mirror element is elliptical in shape and projects illumination light to specimen 201 over a range of angles of incidence. In addition, because the mirror elements are arranged in a toroidal configuration, the mirror elements project illumination light to specimen 201 over a range of azimuth angles. Although, FIG. 15 depicts four mirror elements, in general, focusing optics may include any number of mirror elements arranged to focus light at multiple wavelengths, azimuths and AOI on the same metrology target area. In some other embodiments, focusing optics includes a number of mirror elements nested in the plane of incidence (i.e., a nested Wolter configuration).

In a further aspect, the ranges of wavelengths, AOI, Azimuth, or any combination thereof, projected onto the same metrology area, are adjusted by actively positioning one or more mirror elements of the focusing optics. As depicted in FIG. 14, computing system 230 communicates command signals to actuator system 215 that causes actuator system 215 to adjust the position, alignment, or both, of one or more of the optical elements of focusing optics 211 to achieve the desired ranges of wavelengths, AOI, Azimuth, or any combination thereof, projected onto specimen 201.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an RSAX metrology system (e.g., metrology tool 200) includes one or more beam slits or apertures to shape the illumination beam 214 incident on specimen 201 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, an RSAX metrology system (e.g., metrology tool 200) includes one or more beam slits or apertures to select a set of illumination wavelengths that simultaneously illuminate a metrology target under measurement. In some embodiments, illumination including multiple wavelengths is simultaneously incident on a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 14 depicts a beam divergence control slit 212 located in the beam path between focusing optics 211 and beam shaping slit 213. Beam divergence control slit 212 limits the divergence of the illumination provided to the specimen under measurement. Beam shaping slit 213 is located in the beam path between beam divergence control slit 212 and specimen 201. Beam shaping slit 213 further shapes the incident beam 214 and selects the illumination wavelength(s) of incident beam 214. Beam shaping slit 213 is located in the beam path immediately before specimen 201. In one aspect, the slits of beam shaping slit 213 are located in close proximity to specimen 201 to minimize the enlargement of the incident beam spot size due to beam divergence defined by finite source size.

In some embodiments, beam shaping slit 213 includes multiple, independently actuated beam shaping slits. In one embodiment, beam shaping slit 213 includes four independently actuated beam shaping slits. These four beams shaping slits effectively block a portion of the incoming beam and generate an illumination beam 214 having a box shaped illumination cross-section.

Slits of beam shaping slit 213 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

X-ray detector 219 collects x-ray radiation 218 scattered from specimen 201 and generates output signals 235 indicative of properties of specimen 201 that are sensitive to the incident x-ray radiation in accordance with a RSAXS measurement modality. In some embodiments, scattered x-rays 218 are collected by x-ray detector 219 while specimen positioning system 240 locates and orients specimen 101 to produce angularly resolved scattered x-rays.

In some embodiments, a RSAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 219 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 230 via output signals 235 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, a RSAXS system is employed to determine properties of a specimen (e.g., structural parameter values) based on one or more diffraction orders of scattered light. As depicted in FIG. 14, metrology tool 100 includes a computing system 130 employed to acquire signals 235 generated by detector 219 and determine properties of the specimen based at least in part on the acquired signals.

In some examples, metrology based on RSAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 16:
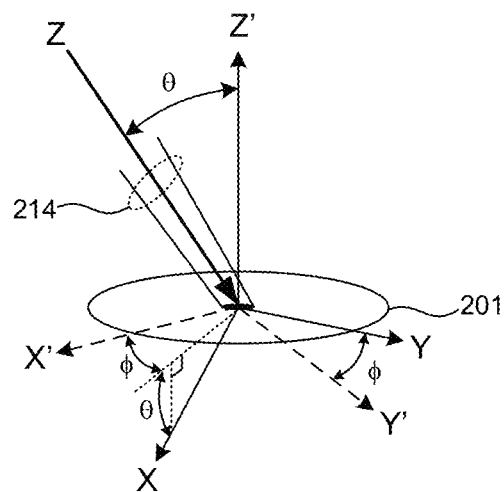
FIG. 16 depicts x-ray illumination beam incident on a wafer at a particular orientation described by an angle of incidence, θ, and an azimuth angle, φ.

Each orientation of the illuminating x-ray beam 214 relative to the surface normal of a semiconductor wafer 201 is described by any two angular rotations of wafer 201 with respect to the x-ray illumination beam 214, or vice-versa. In one example, the orientation can be described with respect to a coordinate system fixed to the wafer. FIG. 16 depicts x-ray illumination beam 214 incident on wafer 201 at a particular orientation described by an angle of incidence, $\theta$, and an azimuth angle, $\phi$. Coordinate frame XYZ is fixed to the metrology system (e.g., illumination beam 216) and coordinate frame X'Y'Z' is fixed to wafer 201. The Y axis is aligned in plane with the surface of wafer 201. X and Z are not aligned with the surface of wafer 201. Z' is aligned with an axis normal to the surface of wafer 201, and X' and Y' are in a plane aligned with the surface of wafer 201. As depicted in FIG. 16, x-ray illumination beam 214 is aligned with the Z-axis and thus lies within the XZ plane. Angle of incidence, $\theta$, describes the orientation of the x-ray illumination beam 214 with respect to the surface normal of the wafer in the XZ plane. Furthermore, azimuth angle, $\phi$, describes the orientation of the XZ plane with respect to the X'Z' plane.

Together, θ and φ, uniquely define the orientation of the x-ray illumination beam 214 with respect to the surface of wafer 201.

In one aspect, metrology tool 100 includes a wafer chuck 203 that fixedly supports wafer 201 and is coupled to specimen positioning system 240. Specimen positioning system 240 configured to actively position specimen 201 in six degrees of freedom with respect to illumination beam 214. In one example, computing system 230 communicates command signals (not shown) to specimen positioning system 240 that indicate the desired position of specimen 201. In response, specimen positioning system 240 generates command signals to the various actuators of specimen positioning system 240 to achieve the desired positioning of specimen 201.

In a further aspect, the focusing optics of an RSAXS system projects an image of the illumination source onto the specimen under measurement with a demagnification of at least five (i.e., magnification factor of 0.2 or less). An RSAXS system as described herein employs a SXR illumination source having a source area characterized by a lateral dimension of 20 micrometers or less (i.e., source size is 20 micrometers or smaller). In some embodiments, focusing optics are employed with a demagnification factor of at least five (i.e., project an image of the source onto the wafer that is five times smaller than the source size) to project illumination onto a specimen with an incident illumination spot size of four micrometers or less.

Figure 17:
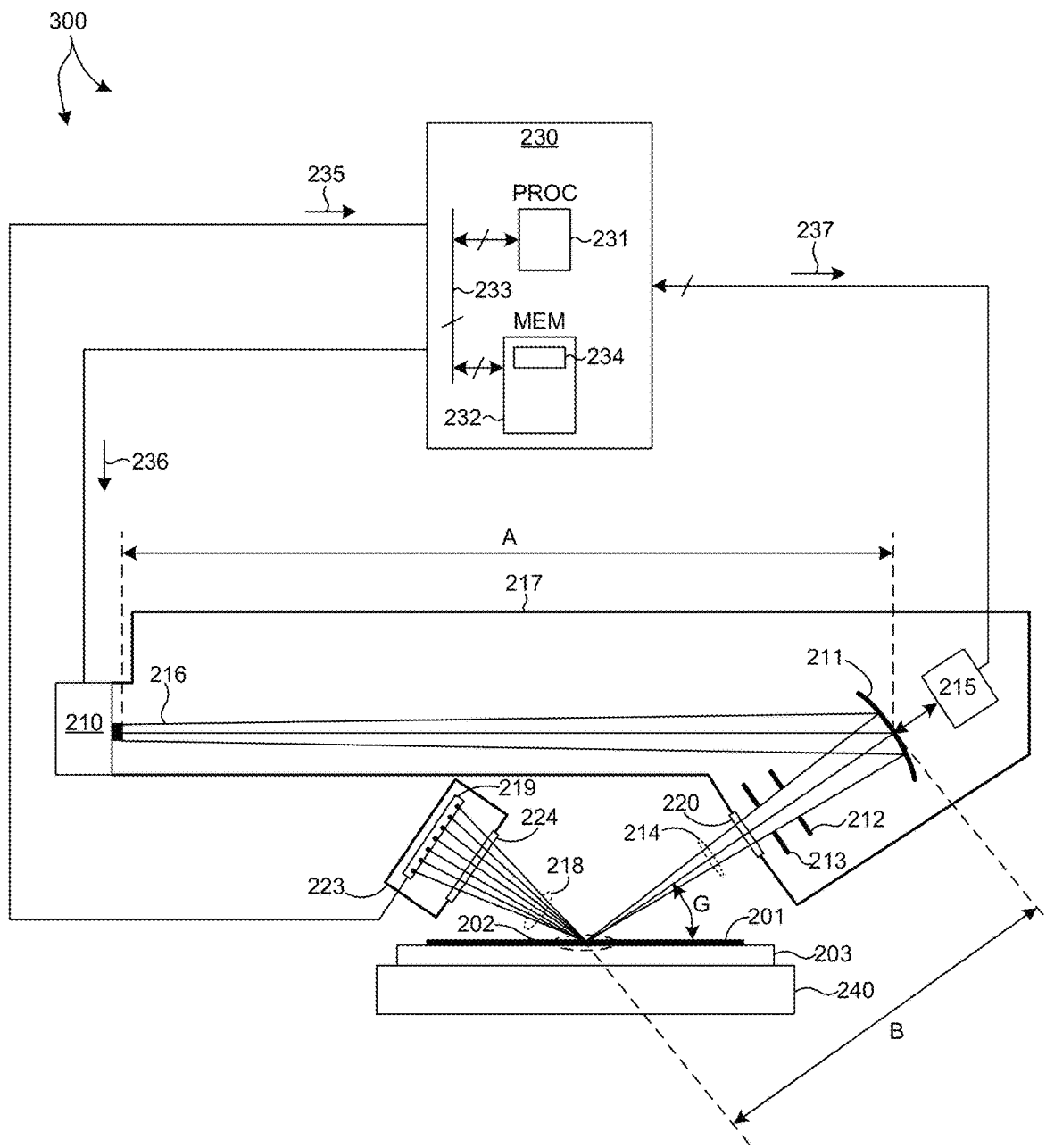
FIG. 17 illustrates another embodiment of a RSAXS metrology tool 300 for measuring characteristics of a specimen in at least one novel aspect.

FIG. 17 illustrates an embodiment of a RSAXS metrology tool 300 in another embodiment. As illustrated in FIG. 17, the system 300 may be used to perform RSAXS measurements over a measurement area 202 having dimensions less than 1-2 micrometers. Like numbered elements depicted in FIG. 17 are analogous to those described with reference to FIG. 14. As depicted in FIG. 17, focusing optics 211 are elliptical optical elements. However, focusing optics 211 are arranged with respect to illumination source 210 and specimen 201 such that the distance, A, between illumination source 210 and focusing optics 211 is significantly greater than the distance, B, between focusing optics 211 and specimen 201. In some embodiments, the ratio of A/B is at least five. In some embodiments, the ratio of A/B is at least ten. This results in a demagnification of the illumination source onto specimen 201 by a factor of A/B. In one embodiment, the size of illumination source 210 is approximately 10 micrometers and focusing optics 211 are arranged such that A/B is ten. In this embodiment, the illumination spot size projected onto specimen 201 is approximately 1 micrometer.

In some embodiments, illumination source 210 is an LPP light source having a source size of 10 micrometers, or less, and focusing optics 211 have a demagnification factor of approximately 10. This enables RSAXS metrology tool 300 to focus illumination light onto a metrology target having dimensions of 1-2 micrometers. By focusing incident illumination light to an illumination spot size of 1-2 micrometers, RSAXS metrology tool 300 enables the measurement of critical dimension targets and overlay targets located in-die, rather than relying on larger metrology targets located in the wafer scribe line areas.

The ability to measure targets having dimensions of 1-2 micrometers reduces the wafer area committed to specialized metrology targets. In addition, the ability to measure targets having dimensions of 1-2 micrometers enables the direct measurement of device structures, rather than specialized metrology targets. Measuring device structures directly eliminates target-to-device bias. This significantly improves measurement quality. In addition, measurements of in-die targets enable characterization of parameter variation within-die. Exemplary parameters of interest include critical dimensions, overlay, and edge placement errors.

In some embodiments, x-ray illumination source 210, focusing optics 211, slits 212 and 213, or any combination thereof, are maintained in the same atmospheric environment as specimen 201 (e.g., gas purge environment). However, in some embodiments, the optical path length between and within any of these elements is long and x-ray scattering in air contributes noise to the image on the detector. Hence in some embodiments, any of x-ray illumination source 210, focusing optics 211, and slits 212 and 213 are maintained in a localized, vacuum environment. In the embodiment depicted in FIG. 14, illumination source 210, focusing optics 211, and slits 212 and 213 are maintained in a controlled environment (e.g., vacuum) within an evacuated flight tube 217. The illumination beam 214 passes through window 220 at the end of flight tube 217 before incidence with specimen 201.

Similarly, in some embodiments, the optical path length between specimen 201 and detector 219 (i.e., the collection beam path) is long and x-ray scattering in air contributes noise to the image on the detector. Hence, in preferred embodiments, a significant portion of the collection beam path length between specimen 201 and detector 219 is maintained in a localized vacuum environment separated from the specimen (e.g., specimen 201) by a vacuum window (e.g., vacuum window 224). In some embodiments, x-ray detector 219 is maintained in the same localized vacuum environment as the beam path length between specimen 201 and detector 219. For example, as depicted in FIG. 14, vacuum chamber 223 maintains a localized vacuum environment surrounding detector 219 and a significant portion of the beam path length between specimen 201 and detector 219.

In some other embodiments, x-ray detector 219 is maintained in the same atmospheric environment as specimen 201 (e.g., gas purge environment). This may be advantageous to remove heat from detector 219. However, in these embodiments, it is preferable to maintain a significant portion of the beam path length between specimen 201 and detector 219 in a localized vacuum environment within a vacuum chamber.

In some embodiments, the entire optical system, including specimen 201, is maintained in vacuum. However, in general, the costs associated with maintaining specimen 201 in vacuum are high due to the complexities associated with the construction of specimen positioning system 240.

In another aspect, metrology tool 200 includes a computing system (e.g., computing system 230) configured to implement beam control functionality as described herein. In the embodiment depicted in FIG. 14, computing system 230 is configured as a beam controller operable to control any of the illumination properties such as intensity, divergence, spot size, polarization, spectrum, and positioning of the incident illumination beam 214.

As illustrated in FIG. 14, computing system 230 is communicatively coupled to detector 219. Computing system 230 is configured to receive measurement data 235 from detector 219. In one example, measurement data 235 includes an indication of the measured response of the specimen (i.e., intensities of the diffraction orders). Based on the distribution of the measured response on the surface of detector 219, the location and area of incidence of illumination beam 214 on specimen 201 is determined by computing system 230. In one example, pattern recognition techniques are applied by computing system 230 to determine the location and area of incidence of illumination beam 214 on specimen 201 based on measurement data 235. In some examples, computing system 230 communicates command signals 236 to x-ray illumination source 210 to select the desired illumination wavelength. In some examples, computing system 230 communicates command signals 237 to actuator subsystem 215 to redirect the x-ray emission to achieve a desired beam direction. In some examples, computing system 230 communicates command signals 238 and 239 to beam shaping slits 212 and 213, respectively, that cause beam shaping slits 212 and 213 to change the beam spot size and select illumination wavelengths such that incident illumination beam 214 arrives at specimen 201 with the desired beam spot size, orientation, and wavelength(s). In one example, command signals 238 and 239 cause actuators associated with slits 212 and 213 to change position to reshape the incident beam 214 to a desired shape and size and select desired wavelengths. In some other examples, computing system 230 communicates a command signal to wafer positioning system 240 to position and orient specimen 201 such that incident illumination beam 214 arrives at the desired location and angular orientation with respect to specimen 201.

In a further aspect, RSAXS measurement data is used to generate an image of a measured structure based on the measured intensities of the detected diffraction orders. In some embodiments, a RSAXS response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on RSAXS measurements, a map of the specimen generated from the same RSAXS measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

It should be recognized that the various steps described throughout the present disclosure may be carried out by a single computer system 230 or, alternatively, a multiple computer system 230. Moreover, different subsystems of the system 200, such as the specimen positioning system 240, may include a computer system suitable for carrying out at least a portion of the steps described herein. Therefore, the aforementioned description should not be interpreted as a limitation on the present invention but merely an illustration. Further, the one or more computing systems 230 may be configured to perform any other step(s) of any of the method embodiments described herein.

In addition, the computer system 230 may be communicatively coupled to the x-ray illumination source 210, beam shaping slits 212 and 213, focusing optics actuator system 215, specimen positioning system 240, and detector 219 in any manner known in the art. For example, the one or more computing systems 230 may be coupled to computing systems associated with the x-ray illumination source 210, beam shaping slits 212 and 213, focusing optics actuator system 215, specimen positioning system 240, and detector 219, respectively. In another example, any of the x-ray illumination source 210, beam shaping slits 212 and 113, focusing optics actuator system 215, specimen positioning system 240, and detector 219 may be controlled directly by a single computer system coupled to computer system 230.

The computer system 230 may be configured to receive and/or acquire data or information from the subsystems of the system (e.g., x-ray illumination source 210, beam shaping slits 212 and 213, focusing optics actuator system 215, specimen positioning system 240, detector 219, and the like) by a transmission medium that may include wireline and/or wireless portions. In this manner, the transmission medium may serve as a data link between the computer system 230 and other subsystems of the system 200.

Computer system 230 of the metrology system 200 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 230 and other systems (e.g., memory on-board metrology system 200, external memory, or external systems). For example, the computing system 230 may be configured to receive measurement data (e.g., signals 235) from a storage medium (e.g., memory 232) via a data link. For instance, spectral results obtained using detector 219 may be stored in a permanent or semi-permanent memory device (e.g., memory 232). In this regard, the measurement results may be imported from on-board memory or from an external memory system. Moreover, the computer system 230 may send data to other systems via a transmission medium. For instance, specimen parameter values determined by computer system 230 may be stored in a permanent or semi-permanent memory device (e.g., memory 232). In this regard, measurement results may be exported to another system.

Computing system 230 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 234 implementing methods such as those described herein may be transmitted over a transmission medium such as a wire, cable, or wireless transmission link. For example, as illustrated in FIG. 14, program instructions stored in memory 232 are transmitted to processor 231 over bus 233. Program instructions 234 are stored in a computer readable medium (e.g., memory 232). Exemplary computer-readable media include read-only memory, a random access memory, a magnetic or optical disk, or a magnetic tape.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a RSAXS analysis are used to control a fabrication process. In one example, RSAXS measurement data collected from one or more targets is sent to a fabrication process tool. The RSAXS measurement data is analyzed as described herein and the results used to adjust the operation of the fabrication process tool to reduce errors in the manufacture of semiconductor structures.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In general, an x-ray based system employing a multilayer optical element with an integrated optical filter as described herein may also include one or more stand-alone transmittance based optical filters to enhance suppression of contamination wavelength bands.

In general an integrated optical filter may be located on any optical element of an x-ray based system. Although the addition of an integrated optical filter to a reflective, multilayer X-ray optical element is described in detail hereinbefore, in general an integrated optical filter may be disposed on any optical element in an optical path of an x-ray based system. In some embodiments, an integrated optical filter is fabricated on a detector entrance window (e.g., camera entrance window). In some embodiments, an integrated optical filter is fabricated on an exit window of an x-ray illumination source, or on a collection cavity of the x-ray illumination source. In this manner, an integrated optical filter may operate in a transmissive mode, i.e., suppressing selected wavelengths from radiation passing through the integrated optical filter in a single pass, or in a reflective mode, i.e., suppressing selected wavelengths from radiation passing through the integrated optical filter in a double pass, depending on the type of optic upon which the integrated optical filter is fabricated.

In one example, one or more integrated optical filters are included in an optical path of a soft x-ray based metrology system employing a laser produced plasma (LPP) light source. Typically, the LPP light source generates harmonics in the IR and visible wavelength ranges. In addition, suppression of undesired EUV wavelengths is also desired. In one example, an integrated optical filter is fabricated on the illumination source window, the detector window, or both, that suppresses IR and visible wavelengths. In addition, another integrated optical filter is fabricated with the multilayer, reflective x-ray focusing optics to suppress undesired EUV wavelengths as described hereinbefore.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with RSAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An x-ray based system, comprising:
   an x-ray illumination source configured to generate an amount of x-ray radiation including a desired range of wavelengths and an undesired range of wavelengths different from the desired range of wavelengths;
   one or more x-ray optical elements each having at least one optical surface disposed in an optical path between the x-ray illumination source and a specimen under process; and
   an integrated optical filter fabricated on the optical surface of at least one of the one or more x-ray optical elements, the integrated optical filter including one or more material layers that absorb radiation within the undesired range of wavelengths and transmit radiation within the desired range of wavelengths.

2. The x-ray based system of claim 1, wherein the integrated optical filter is disposed over a multilayer x-ray reflecting structure fabricated over the optical surface of the at least one of the plurality of x-ray optical elements.

3. The x-ray based system of claim 2, further comprising:
   a diffusion barrier layer, the diffusion barrier layer disposed between the one or more material layers of the integrated optical filter and the multilayer x-ray reflecting structure, disposed between the optical surface and the multilayer x-ray reflecting structure, or disposed over the one or more material layers of the integrated optical filter.

4. The x-ray based system of claim 1, wherein the optical surface of the at least one of the one or more x-ray optical elements is curved.

5. The x-ray based system of claim 1, wherein a thickness of the integrated optical filter varies as a function of location on the optical surface of the at least one of the one or more x-ray optical elements.

6. The x-ray based system of claim 1, wherein the metrology system is a soft x-ray reflectometry system.

7. The x-ray based system of claim 6, wherein the soft x-ray reflectometry system operates in a grazing incidence mode.

8. The x-ray based system of claim 6, wherein the soft x-ray reflectometry system operates in an imaging mode.

9. The x-ray based system of claim 1, further comprising:
   a stand-alone optical filter disposed in the optical path between the x-ray illumination source and the specimen.

* * * * *